United States Patent
Hsu

(10) Patent No.: US 6,258,643 B1
(45) Date of Patent: Jul. 10, 2001

(54) METHOD FOR FORMING TWIN GATE CMOS

(75) Inventor: Shih-Ying Hsu, Hsin-Chu (TW)

(73) Assignee: United Microelectronics Corp., Hsin-Chu (TW)

( * ) Notice: Subject to any disclaimer, the term of this patent is extended or adjusted under 35 U.S.C. 154(b) by 0 days.

(21) Appl. No.: 09/344,691

(22) Filed: Jun. 25, 1999

(51) Int. Cl.$^7$ ................................................ H01L 21/8238
(52) U.S. Cl. ........................... 438/199; 438/782; 427/240
(58) Field of Search .................................... 438/782, 199, 438/224, 228; 427/240; 118/52

(56) References Cited

U.S. PATENT DOCUMENTS 5,503,882 * 4/1996 Dawson .............................. 427/579
5,923,984 * 7/1999 Gardner et al. ...................... 438/289

OTHER PUBLICATIONS

Wolf, S.; Silicon Processing for the VLSI Era Vol. 2: Process Integration, Sunset Beach, CA, 1990, pp. 223, 224, 238 and 239.*

* cited by examiner

Primary Examiner—John F. Niebling
Assistant Examiner—Christopher Lattin

(57) ABSTRACT

A method for forming an adapted small dimension and more quality fabrication is disclosed. In one embodiment, the present invention provides a twin gate CMOS, which includes isolations formed in a semiconductor substrate. A P-well and an N-well inside the semiconductor substrate are formed and isolated by an isolating region. Next, a gate oxide layer and a first polysilicon layer are formed sequentially above the P-well and an N-well. A polysilicon layer doped in-situ with N-type ions. Sequentially, a first oxide layer is deposited and a first photoresist layer is formed on the polysilicon layer above P-well region, wherein etching respective patterns on the first oxide layer and the polysilicon layer. An amorphous silicon layer doped with P-type ions by implanation is formed over the gate oxide layer and the first oxide layer above the semiconductor substrate. After forming a second oxide layer on the amorphous silicon layer. A SOG (spin-on glass) layer is deposited above the substrate, and then the SOG (spin-on glass) layer, major second oxide layer and a portion of amorphous silicon layer are removed until the first oxide layer is exposed by chemical mechanical polishing. Next, first etch bulgy P$^+$-type amorphous silicon layer until the amorphous silicon layer surface is smooth, and then etch back the first dielectric layer and second dielectric layer. Finally, respectively forming a P$^+$-type gate above the N-well and a N$^+$-type gate on the P-well.

7 Claims, 7 Drawing Sheets

METHOD FOR FORMING TWIN GATE CMOS

BACKGROUND OF THE INVENTION

1. Field of the Invention

The present invention relates to a method for forming a twin gate CMOS, wherein small dimension and more quality fabrication can 10 be achieved.

2. Description of the Prior Art

In the conventional method for manufacturing twin gate transistors, the gates of the transistor are first defined on an undoped conducting layer, generally, followed by a channel implantation, which forms the source/drain terminals such that the conducting layer of the gate is doped in situ to increase its electrical conductivity. With the current trend of heavy reduction of semiconductor component dimensions in integrated circuits and the importance of preventing the short channel effect in the transistors due to excessive thickness in the source/drain diffusion regions, such layers have had to become thinner and thinner; and as a result, the impurity concentration resulting from channel implantation is also necessarily becoming lighter and lighter. Therefore, after the ion doping operation the impurity concentration in the conducting layer of the gate may be insufficient, which leads to an increase in sheet resistance and may affect both its electrical conductivity and the threshold voltage (Vt) level of the transistor.

In an improved version of the conventional method of fabricating a twin gate CMOS, in order to lessen the effects on threshold voltage level caused by low impurity concentration in the gates of the twin gate transistor, a heavier doping of impurities is performed in situ with the formation of the conducting layer of the transistor. The details of such a method are illustrated in FIGS. 1A through 1G.

First, referring to FIG. 1A, a P-well 140 and a N-well 160, with an isolating region 180 there between, are formed adjacent to each other on a P-type silicon substrate 100. Then the isolating region 180 is formed of an insulating material such as silicon dioxide. Next, a thermal oxidation method is used to form a gate oxide layer 200 on the substrate surface, and thereafter, chemical vapor deposition (CVD) is used to form a conductive layer 210 above the gate oxide layer 200. The conductive layer 210, for example, can be a polysilicon layer formed by deposition using disilane gas ($Si_2H_6$) and with P-type ion doping, for example, using diborane ($B_2H_6$), performed in situ for convening the polysilicon layer into a $P^+$-type polysilicon layer 210. Then, a first photoresist layer 230 is formed over the surface of the $P^+$-type polysilicon layer 210 above the N-type well 160.

Referring to FIG. 1B, in a subsequent step the exposed $P^+$-type polysilicon layer 210 is etched until the upper surface of the gate oxide layer 200 is exposed. Then, the first photoresist layer 230 is removed. The CVD is again used to form a polysilicon layer 250 on the surfaces of the exposed gate oxide layer 200 and $P^+$-type polysilicon layer 210. The deposition uses disilane gas with N-type ion doping, for example, $PH_3$ performed in situ doped, to convert the polysilicon layer into an $N^+$-type polysilicon layer 250.

Referring next to FIG. 1C, in the subsequent step a second photoresist layer 270 is formed over the surface of the $N^+$-type polysilicon layer 250 above the P-type well region 140, and then is etched back until the upper surface of the $P^+$-type polysilicon layer 210 is exposed.

Referring next to FIG. 1D, the second photoresist layer 270 is removed. Then, using a conventional photolithographic technique, a third photoresist layer 290 is formed above the respective $N^+$-type 250 and $P^+$-type polysilicon layer 210 as a mask for defining the gates in subsequent steps. Due to misalignment of photoresist layer 270, there may be a gap in between the $N^+$-type 250 and $P^+$-type polysilicon layer 210 in the following etch step.

Referring next to FIG. 1E, with the third photoresist layer as a mask, the $P^+$ and $N^+$ type polysilicon layers are etched to mark out a $P^+$-type polysilicon gate 330 and an $N^+$-type polysilicon gate 310, and then the third photoresist layer is removed. Sequentially, under high heat and in a steamy environment, thin layer of oxide 500P and 500N are formed on the respective surfaces of the $P^+$-type 330 and $N^+$-type polysilicon gate 310. Next, a conventional photolithographic technique is again used to form a fourth photoresist layer 370 over the surface of the gate oxide layer SOOP above the N-type well regions 160 and covering up the $P^+$-type polysilicon gate 330. Subsequently, N-type ions, for example, arsenic ions 390I, is used in a channel implantation process, to form $N^+$-type source/drain of diffusion regions 390 on the substrate surface, on each side of the $N^+$-type polysilicon gate 310, thus completing the NMOS part of the CMOS component.

Referring next to FIG. 1F, in the subsequent step a fifth photoresist layer 410 is formed over the surface of the thin oxide layer 500N above the P-type well 140 and covering up the $N^+$-type polysilicon gate terminal 310. Subsequently, P-type ions, for example, boron fluoride ions 430I, is used in a channel implantation process, to forming $P^+$-type source/drain of diffusion regions 430 on the substrate surface on each side of the $P^+$-type polysilicon gate 330, thus completing the PMOS part of the CMOS component. Next, referring to FIG. 1G, the fifth photoresist layer 410 is removed to complete the twin gate transistor.

Although the improved method for fabricating conventional twin-gate CMOS mentioned previously can solve the problem of unstable threshold voltage causes by low doping density for twin-gate, there still comes with the following disadvantages. For in-situ doped $P^+$-type gates, due to the high doping concentration at the interface between a $P^+$-type polysilicon layer and a gate oxide layer, boron ions might easily penetrate through the gate oxide layer, hence, results in a shifting of the threshold voltage. Moreover, referring to what is shown in FIG. 1C, when taking photoresist 270 as a mask to etch $N^+$-type polysilicon layer, it is easy to result in a disconnection between $P^+$-type and $N^+$-type polysilicon layer, like what is shown in FIG. 1D, due to the misalignment of photoresist 270. Thus, this disconnection will result in an entire circuit malfunction in CMOS circuits wherein $P^+$-type and $N^+$-type polysilicon layer connections are usually needed.

SUMMARY OF THE INVENTION

In accordance with the present invention, a method is provided for fabricating twin gate CMOS. Owing to the use of a method, so that the provided twin gate CMOS can be adapted small dimension and more quality fabrication.

Another purpose of the present invention is to provide a twin gate CMOS with an amorphous silicon layer, thereby avoiding boron and boron fluoride to penetrate through gate oxide into N-well region.

A further purpose of the present invention is to provide for fabricating twin gate CMOS. Thereby misalignment problem in the photoresist layer which results in a disconnection between $P^+$-type and $N^+$-type polysilicon layer can be solved.

In one embodiment, the present invention provides a twin gate CMOS, which includes isolations formed in a semiconductor substrate. A P-well and N-well are formed on two sides of the isolation. Next, then a gate oxide layer is formed on the P-well and N-well. An $N^+$-type polysilicon layer in-situ doped with N-type ions is formed on the gate oxide layer. Sequentially, a cap oxide layer is deposited and a first photoresist layer is formed in order on the $N^+$-type polysilicon layer, wherein etching respective patterns on the cap oxide layer and the $N^+$type polysilicon layer until the gate oxide is exposed. Then, form an amorphous silicon layer above the surfaces of the exposed gate oxide layer and the cap oxide layer, then doped with P-type ions by implantation. After forming a dielectric layer on the amorphous silicon layer, a SOG (spin-on glass) layer is deposited above the substrate, and then remove the SOG layer, major the dielectric layer, and a portion of the amorphous silicon layer until the said cap oxide layer is exposed by chemical mechanical polishing. Next, etching back the bulgy amorphous silicon layer, and then etch the remained dielectric layer and cap oxide layer until upper surface of the $N^+$-type polysilicon layer and amorphous silicon layer are exposed. Finally, using photolithographic and etching processes to define respective patterns on the portions of polysilicon layer and amorphous silicon layer, thereby respectively to form a $P^+$-type gate on N-well and a $N^+$-type gate on the P-well.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DESCRIPTION OF THE PREFERRED EMBODIMENT

Figure 1A:
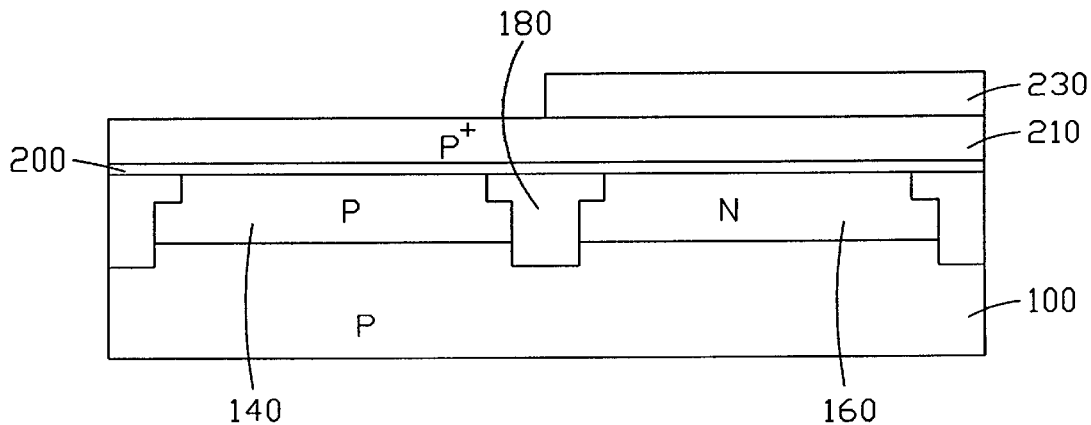
FIGS. 1A to 1G show cross-sectional views illustrative of various stages in the fabrication of a conventional twin gate CMOS component.
Figure 1B:
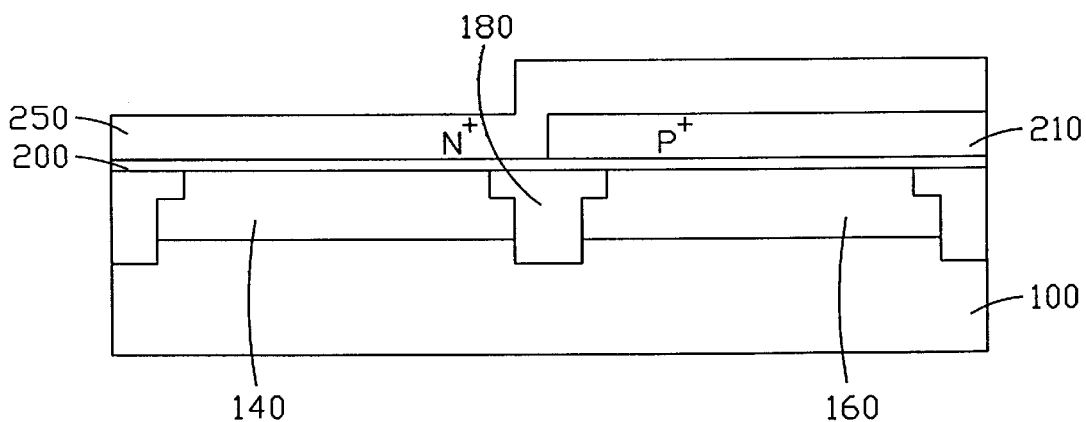
Figure 1C:
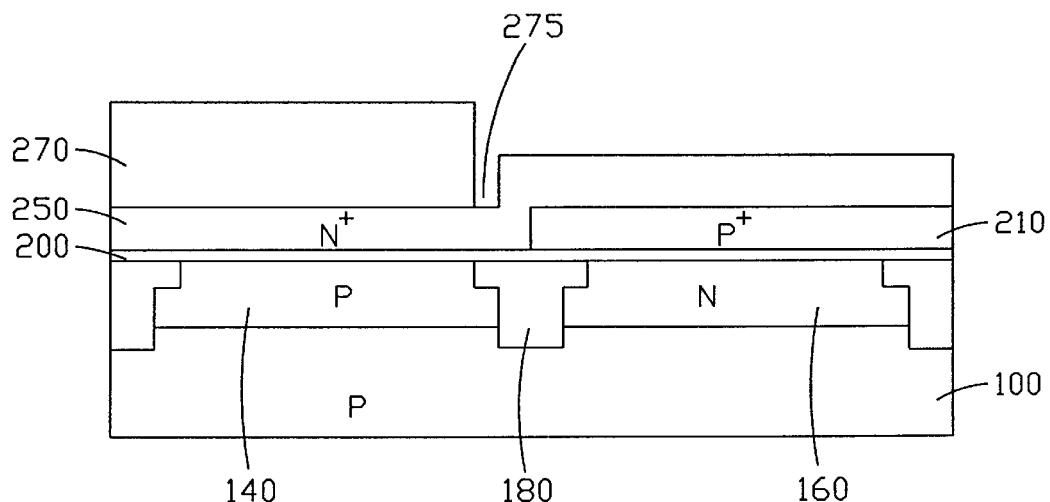
Figure 1D:
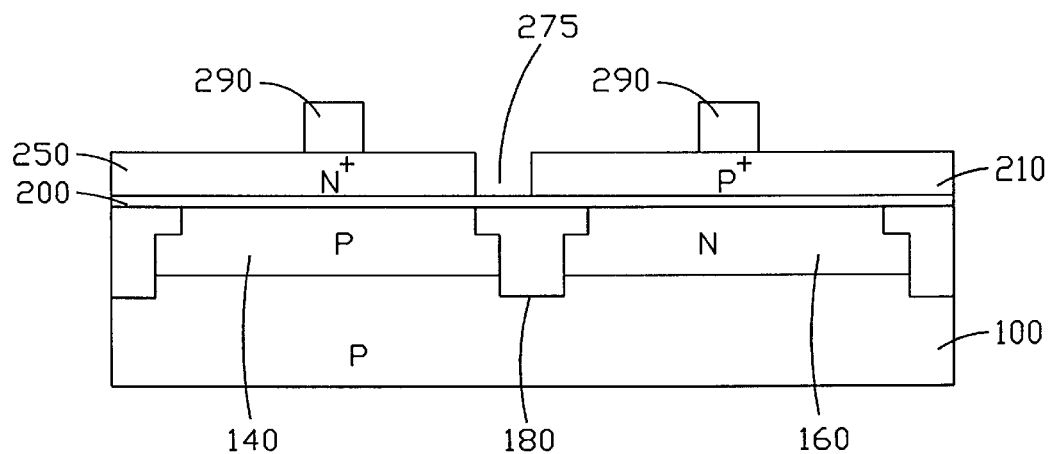
Figure 1E:
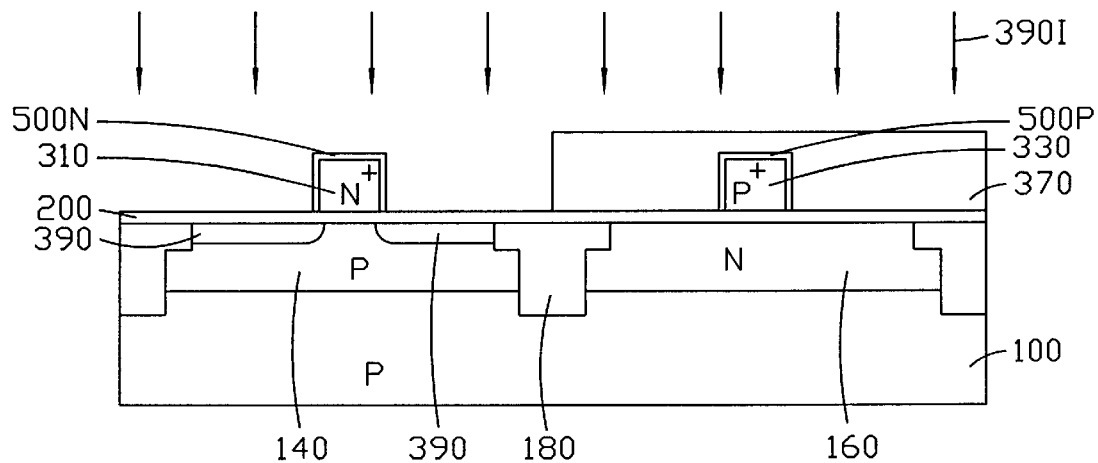
Figure 1F:
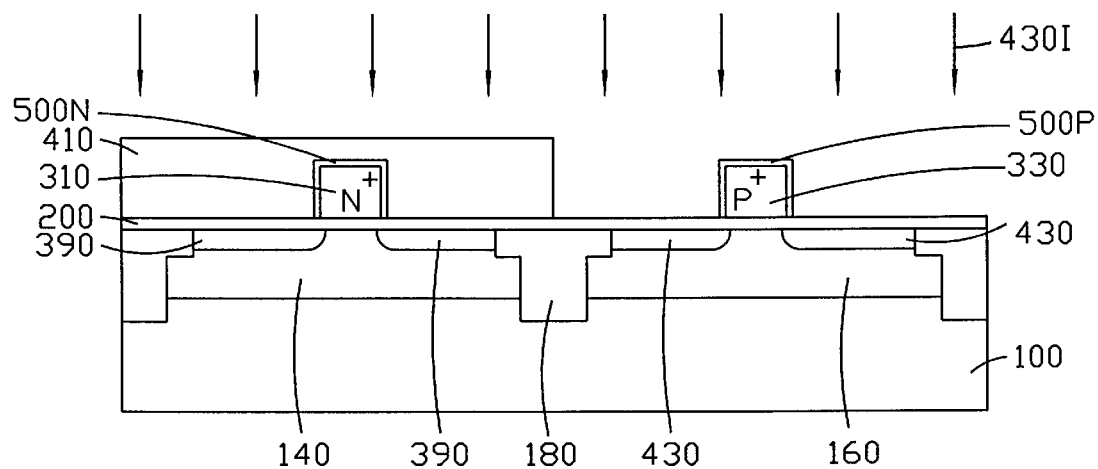
Figure 1G:
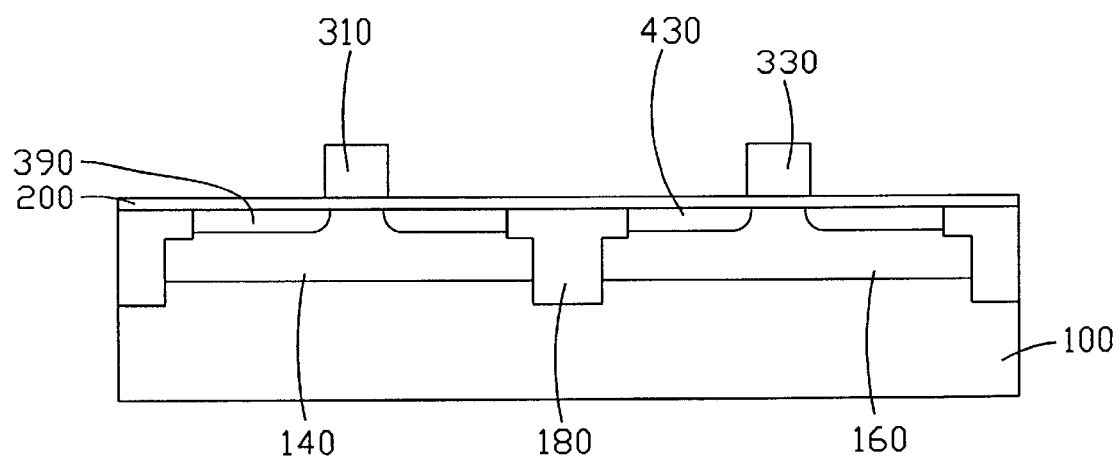
Figure 2:
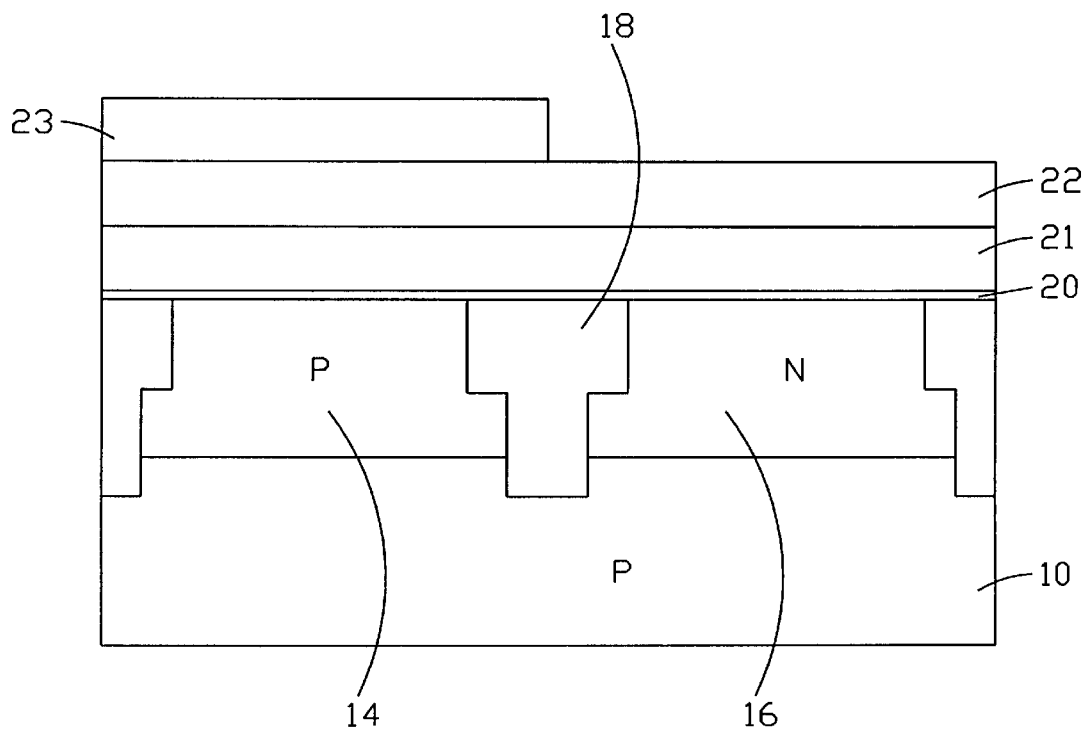
FIGS. 2 to 7 show cross-sectional views illustrative of various stages in the fabrication of a twin gate CMOS component in accordance with one embodiment of the present invention.

In FIG. 2, the isolation 18 is formed of an insulating material such as silicon dioxide. And then, a P-well 14 and an N-well 16 are formed by two sides of an isolation 18, are formed adjacent to each other on a P-type silicon substrate 10. Next, a gate oxide layer 20 is formed above the substrate surface by thermal oxidation, with a thickness preferably in the range of 8nm to 15nm. Then, chemical vapor deposition (CVD) is used to form a conducting layer 21 above the gate oxide layer 20. The conducting layer 21, for example, can be a polysilicon layer 21 with a thickness preferably in the range of 1500–2500 angstrom. Perform a deposition of the polysilicon layer 21 in-situ doped $PH_3$ for convening the polysilicon layer 21 into $N^+$-type polysilicon layer 21. Then, a cap oxide layer 22, such as tetraethyl-orthosilicate (TEOS) is formed above $N^+$-type polysilicon layer 21, by, for example, a conventional chemical vapor deposition (CVD). The thickness of the cap oxide layer 22 is preferably about 3000–8000 angstrom. Subsequently, a photoresist layer 23 is formed and patterned above the cap oxide layer 22 using conventional photolithography techniques, defining a $N^+$-type gate area over the gate oxide 20 above a portion of P-well 14, wherein etching respective patterns on the cap oxide layer 22 and the $N^+$-type polysilicon layer 21 until the gate oxide 20 is exposed.

Figure 3:
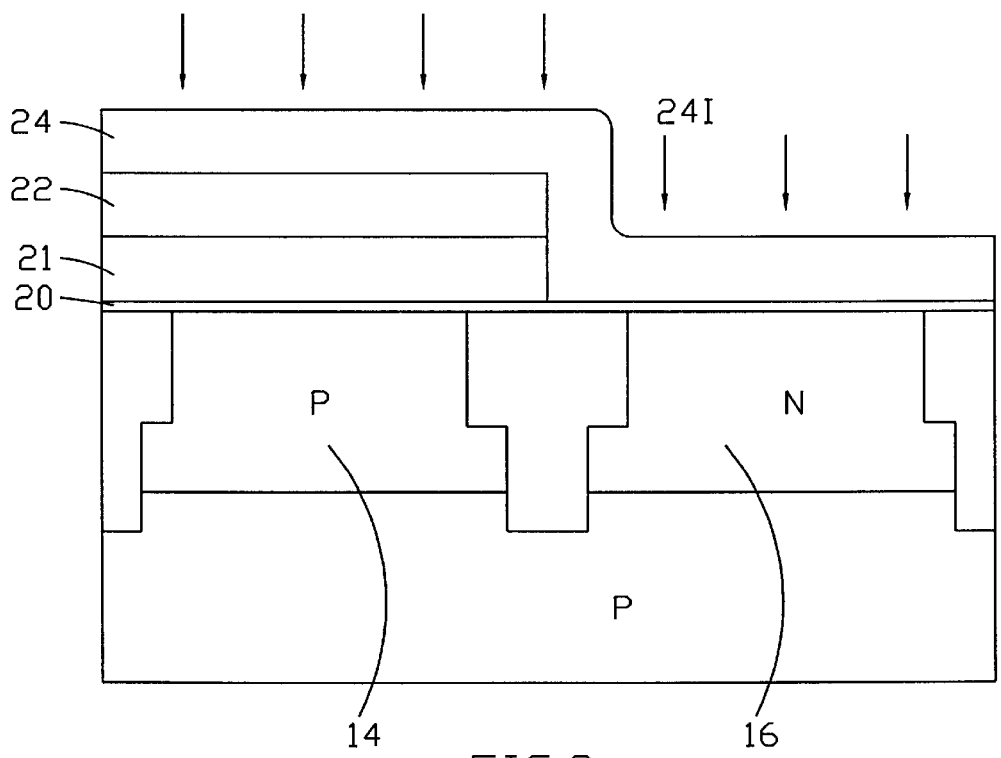

Referring to FIG. 3, chemical vapor deposition (CVD) is again used to form an amorphous silicon layer 24 above the surfaces of the exposed gate oxide layer 20 and the cap oxide layer 22. The amorphous silicon layer 24 is doped by implanation 24I using boron fluoride ions ($BF_2$) or boron ions for convening the amorphous silicon layer 24 into a $P^+$-type polysilicon layer 24. Here, using amorphous silicon layer 24 aims to avoid boron ions might easily penetrate through the gate oxide layer, hence, results in a shifting of the threshold voltage. Moreover, the amorphous silicon layer 24 doped by implanation 24I can well control the doping concentration at the interface between amorphous silicon layer 24 and gate oxide layer 20 that is also beneficial to prevent boron penetration.

Figure 4:
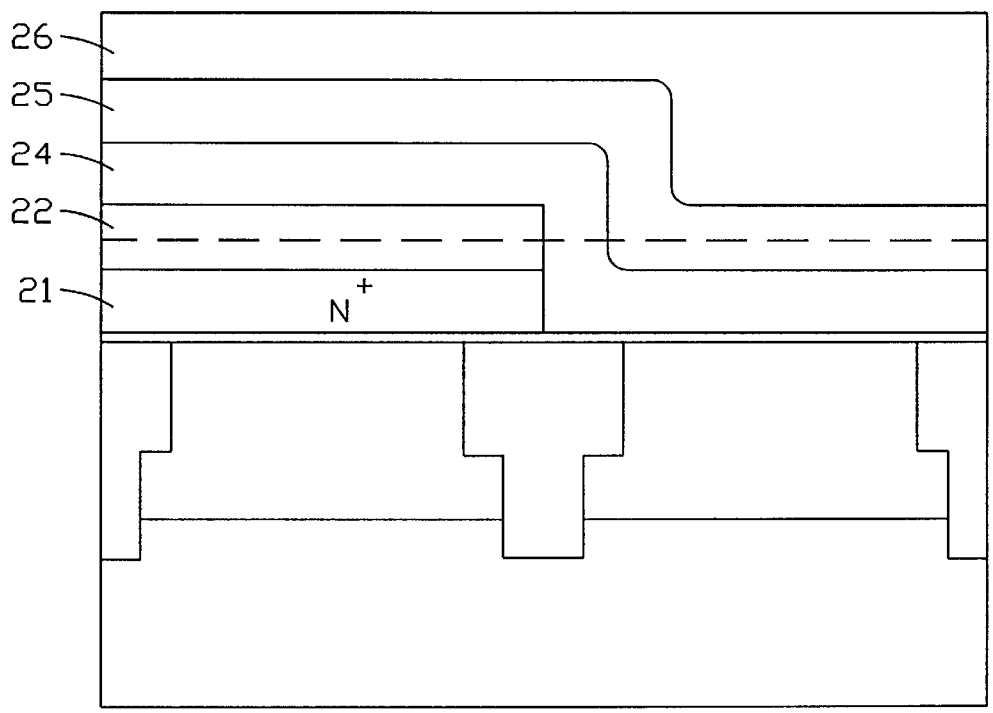

In the structure of FIG. 4, a dielectric layer 25, such as tetraethyl-orthosilicate (TEOS) is formed above $P^+$-type polysilicon layer 24, by, for example, a conventional chemical vapor deposition (CVD). The thickness of the dielectric layer 25 is preferably about 3000–8000 angstrom. A spin on glass (SOG) layer 26 such as silicate or siloxane is deposited over the substrate 10, general followed by a planarization process such as chemical mechanical polishing (CMP). Because the coating dielectric material can be flowing around the wafer surface in accompanying with the solvent, hence, achieving a planarized surface. The dishing effect causes by height differences, which erodes the $P^+$-type amorphous layer 24 on the top of the gate oxide layer 20, can be avoided during the CMP process that follows.

Figure 5:
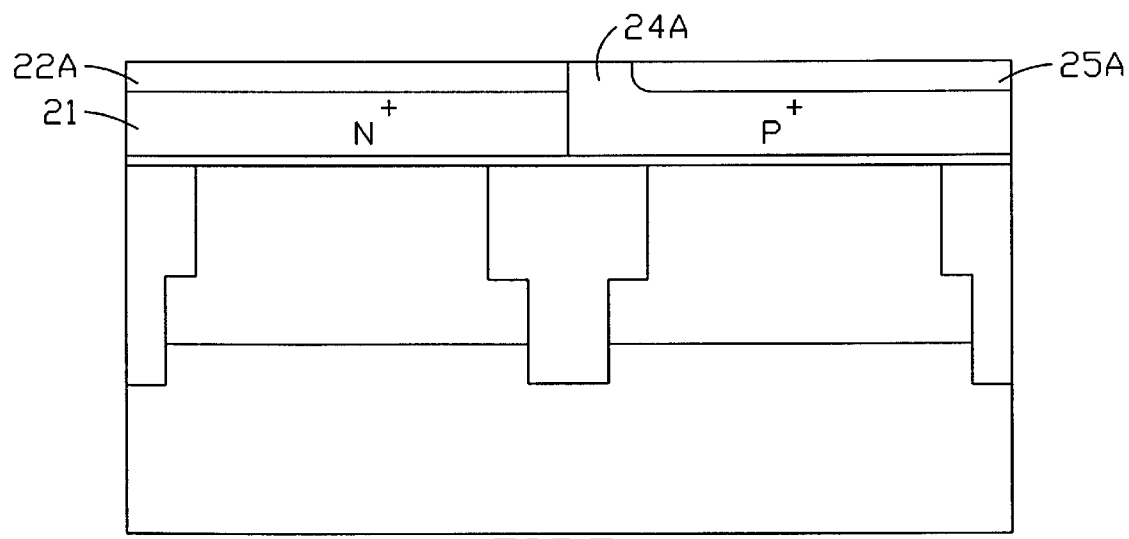

Referring to the FIG. 5, remove the SOG layer 26, the major dielectric layer 25, a portion of the $P^+$-type amorphous silicon layer 24 until the cap oxide layer 22 is exposed by chemical mechanical polishing.

Figure 6:
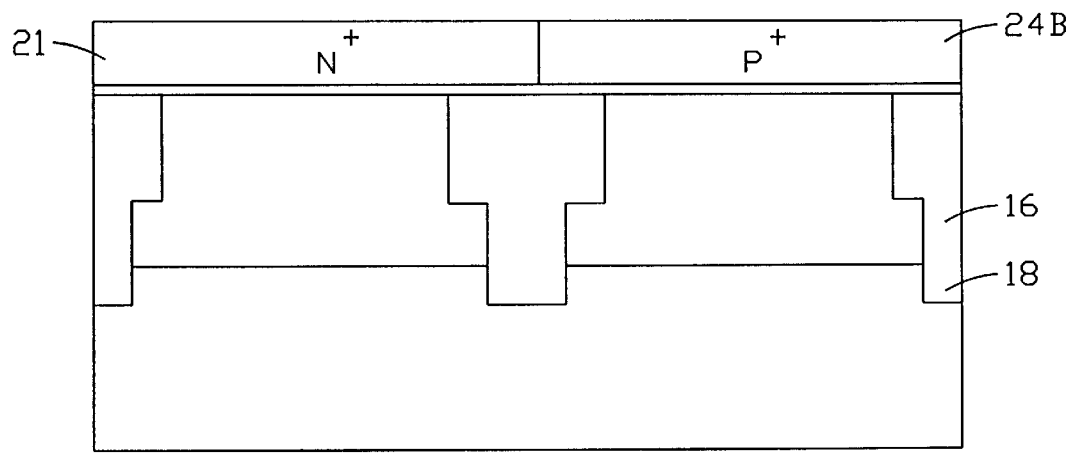

Referring to the FIG. 6, first etch back the bulgy $P^+$-type amorphous silicon layer 24A to obtain smooth connection between $P^+$-type amorphous silicon layer and $N^+$-type polysilicon layer. And then etch the remained cap oxide layer 22A and the remained dielectric layer 25A untill upper portion of the $N^+$-type polysilicon layer 21 and $P^+$-type amorphous silicon layer 24B are exposed, wherein the amorphous silicon layer 24B defines a $P^+$-type gate area of CMOS circuits.

Figure 7:
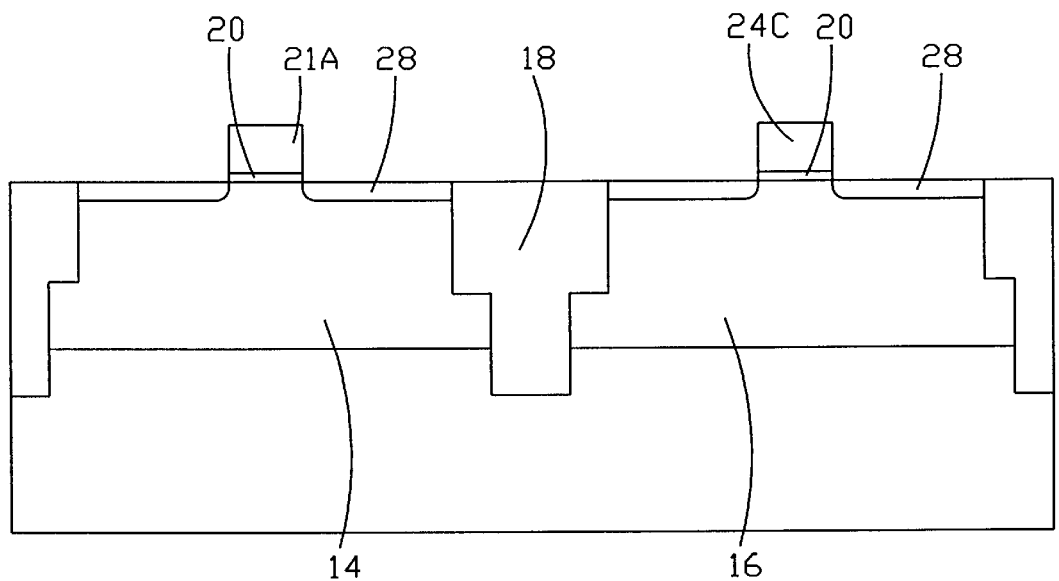

Finally, referring to the FIG. 7, using conventional photolithography techniques, defining a $N^+$-type gate area and a $P^+$-type gate area over a portion of P-well 14 and N-well 16 above the silicon substrate 10. The $N^+$-type polysilicon layer 21 and $P^+$-type amorphous silicon layer 24B are anisotropically etched by, for example, a conventional dry etch or reactive ion etch (RIE) technique, and therefore a twin gate structure of CMOS which includes a $N^+$-type gate 21B and $P^+$-type gate 24C are formed.

Although specific embodiments have been illustrated and described, it will be obvious to those skilled in the art that various modifications may be made without departing from what is intended to be limited solely by the appended claims.

What is claimed is:

1. A method for fabricating a twin gate CMOS, said method comprising:

providing a semiconductor substrate incorporating a device;

forming isolations in the semiconductor substrate;

forming a P-well and N-well on two sides of said isolation;

forming a gate oxide layer above said P-well and N-well;

forming a polysilicon layer in-situ doped with first conductivity-type ions above said gate oxide layer;

in order forming a first dielectric layer and a first photoresist layer above said polysilicon layer, wherein etching respective patterns on said first dielectric layer and said polysilicon layer until the said gate oxide is exposed, wherein the remained polysilicon layer defines a $N^+$-type gate area of CMOS circuits;

depositing a amorphous silicon layer, and then doped with second conductivity-type ions by implantation on said gate oxide layer above said semiconductor substrate;

forming a second dielectric layer on said amorphous silicon layer;

depositing a SOG (spin-on glass) layer above the semiconductor substrate;

removing said SOG layer, major said second dielectric layer, and a portion of said amorphous silicon layer until said first dielectric layer is exposed by chemical mechanical polishing; and etching back the bulgy amorphous silicon layer, and then etch the first dielectric layer and second dielectric layer until upper portion of the $N^+$-type polysilicon layer and $P^+$-type amorphous silicon layer are exposed, wherein said amorphous silicon layer to define a $P^+$-type gate area of CMOS circuits.

2. The method according to claim 1, wherein said isolation region comprises silicon dioxide.

3. The method according to claim 1, wherein said first dielectric layer comprises tetraethyl-orthosilicate (TEOS).

4. The method according to claim 1, wherein said second dielectric layer comprises tetraethyl-orthosilicate (TEOS).

5. The method according to claim 1, wherein said SOG (spin-on glass) layer comprises silicate or siloxane.

6. The method according to claim 1, wherein the ions of said first conductivity-type are chosen from an N-type ion group consisting of arsenic and phosphorous ions.

7. The method according to claim 1, wherein the ions of said second conductivity-type are chosen from an P-type ion group consisting of boron and boron fluoride ions.

* * * * *